United States Patent [19]

Kasamizugami et al.

[11] Patent Number: 5,559,747
[45] Date of Patent: Sep. 24, 1996

[54] STATIC RAM AND PROCESSING APPARATUS INCLUDING STATIC RAM

[75] Inventors: Masayoshi Kasamizugami; Takuya Kokuryo, both of Kawasaki, Japan

[73] Assignee: Fujitsu Limited, Kawasaki, Japan

[21] Appl. No.: 496,184

[22] Filed: Jun. 28, 1995

[30] Foreign Application Priority Data

Aug. 25, 1994 [JP] Japan .................................. 6-200619

[51] Int. Cl.⁶ ............................................ G11C 7/02
[52] U.S. Cl. .................. 365/207; 365/208; 365/189.05; 365/189.11
[58] Field of Search .................. 365/207, 208, 365/189.11, 189.05

[56] References Cited

U.S. PATENT DOCUMENTS 5,394,361  2/1995  Dickinson ........................ 365/189.05

Primary Examiner—David C. Nelms
Assistant Examiner—F. Niranjan
Attorney, Agent, or Firm—Armstrong, Westerman, Hattori, McLeland & Naughton

[57] ABSTRACT

A static RAM is disclosed wherein a combination logic circuit can operate at a higher speed to improve the throughput and the load such as the number of gates and/or wiring lines connected to a data output line can be reduced. The static RAM comprises a RAM cell for storing data, a differential amplifier for amplifying a signal read out from the RAM cell, a level keeping circuit for keeping a level of a signal outputted from the differential amplifier, a first output line for outputting an output signal of a kept level from the level keeping circuit upon reading accessing to the static RAM as a static output, and a second output line for outputting a state of at least one of a positive phase bit line and an inverted phase bit line of the differential amplifier upon reading accessing to the static RAM as a dynamic output. The static RAM can be suitably used with an associative storage circuit represented by a tag RAM circuit of a cache memory system and like storage circuits.

5 Claims, 12 Drawing Sheets

STATIC RAM AND PROCESSING APPARATUS INCLUDING STATIC RAM

BACKGROUND OF THE INVENTION

1. Field of the Invention

This invention relates to a static RAM (SRAM) which employs a dynamic circuit for pre-charging and discharging a bit line and a processing apparatus which includes a static RAM of the type mentioned, and more particularly to a static RAM and a processing apparatus which are suitably used with an associative storage circuit represented by a tag RAM circuit of a cache memory system of the direct mapping type, the set associative mapping type or a like type.

2. Description of the Related Art

An exemplary one of ordinary processing apparatus which employ a static RAM is shown in FIG. 13. Referring to FIG. 13, the processing apparatus shown includes a pair of static RAMs (which may be hereinafter referred to as SRAMs) 50A and 50B. Each of the SRAMs 50A and 50B is of the n-bit x m-entry type and is shown employing a dynamic circuit for pre-charging and discharging bit lines.

The processing apparatus further includes a pair of flip-flops (FF) 51A and 51B for fetching and temporarily storing data di(0:n) (n bits from 0 to n-1) to be written into the SRAMs 50A and 50B in response to a clock signal and outputting the stored data di(0:n), respectively, a pair of decoders (DEC) 52A and 52B for the SRAMs 50A and 50B, respectively, and a pair of flip-flop apparatus (FF) 53A and 53B for fetching and temporarily storing data do(0:n) outputted from the SRAMs 50A and 50B in response to the clock signal and outputting the stored data do(0:n), respectively.

The processing apparatus further includes a pair of parity check circuits (PCHK) 54A and 54B for checking parity of data outputted from the SRAMs 50A and 50B, respectively, a comparison circuit (CMP) 55 for comparing data outputted from the SRAMs 50A and 50B to check whether or not they coincide with each other, a pair of flip-flops (FF) 56A and 56B for fetching and temporarily storing results pchk of parity checks from the parity check circuits 54A and 54B in response to the clock signal and outputting the stored parity check results pchk, respectively, and a flip-flop (FF) 57 for fetching and temporarily storing a result of comparison (active low) from the comparison circuit 55 in response to the clock signal and outputting the stored comparison result. The processing apparatus further includes an inverter 58 for inverting an active-low pre-charge signal for pre-charging bit lines of the SRAMs 50A and 50B and inputting the inverted pre-charge signal to the SRAMs 50A and 50B. A pre-charge period of the SRAMs 50A and 50B is offset by one half cycle from a pre-charge period of the other components.

With the ordinary processing apparatus, irrespective of whether or not a dynamic circuit is used for the SRAMs 50A and 50B, only a static output of a kept level is normally used as an output of the processing apparatus.

The processing apparatus described above with reference to FIG. 13 is used, for example, to check a tag of a cache memory (not shown) of the direct mapping type, that is, to determine whether or not data of a requested address is stored in the cache memory (hit/miss). For example, tag information of the cache memory (part of address information of data stored in the cache memory) is stored in the SRAM 50A while a physical address of the requested address is stored into the SRAM 50B. In other words, the SRAM 50B functions as a physical address storage section of an address translation buffer (TLB: Translation Lookaside Buffer).

When data are outputted from the SRAMs 50A and 50B, parity checks of the data are performed by the parity check circuits 54A and 54B, respectively, and address information from the SRAMs 50A and 50B is compared with each other by the comparison circuit 55. If coincidence is detected as a result of the comparison, the comparison circuit 55 determines this as a cache hit and outputs a hit signal. Consequently, the cache memory is accessed in accordance with the address information from the SRAM 50A or 50B stored in the flip-flop apparatus 53A or 53B so that data are read out from the cache memory.

The timings of such operations of the processing apparatus as described above are illustrated in FIG. 14. Referring to FIG. 14, if the SRAMs 50A and 50B are accessed for reading at a timing T1 at which the clock signal clk rises, then data (address information) corresponding to the reading accessing are outputted from the SRAMs 50A and 50B at a next timing T2. Then at a further timing T3, the data outputs from the SRAMs 50A and 50B are compared with each other by the comparison circuit 55, and a result cmp of the comparison is stored into the flip-flop 57. Thereafter, at a next timing T4 at which the clock signal clk rises, the comparison result cmp is outputted as cache hit/miss information from the flip-flop 57.

With the ordinary processing apparatus which includes the SRAMs 50A and 50B described above, however, since the SRAMs 50A and 50B output only static outputs of kept levels irrespective of whether or not a dynamic circuit is used for the SRAMs 50A and 50B, there is a problem to be solved in that a delay time after which data read out from a RAM cell appears by way of a sense amplifier (differential amplifier) and a level keeping circuit provides a severe restriction to the propagation delay time/setup time and the number of stages of gates of any circuit (such as the parity check circuit 54A or 54B or the comparison circuit 55) which receives the output data.

Further, since the conventional SRAMs 50A and 50B include only one kind of output lines (do(0:n) in FIG. 13) of a kept level, the load such as the number of gates and/or wiring lines connected to the output lines is accordingly great, and this provides a corresponding long delay time. Consequently, more severe timings are required for a system for which a shorter clock cycle and a higher speed operation are required.

SUMMARY OF THE INVENTION

It is an object of the present invention to provide a static RAM wherein a combination logic circuit can operate at a higher speed to improve the throughput and the load such as the number of gates and/or wiring lines connected to data output lines can be reduced and a processing apparatus which employs the static RAM.

In order to attain the object described above, according to an aspect of the present invention, there is provided a static RAM constructed using a dynamic circuit for pre-charging and discharging a bit line, comprising a RAM cell for storing data, a differential amplifier for amplifying a signal read out from the RAM cell, a level keeping circuit for keeping a level of a signal outputted from the differential amplifier, a first output line for outputting an output signal of a kept level from the level keeping circuit upon reading accessing to the static RAM as a static output, and a second output line for outputting a state of at least one of a positive phase bit line and an inverted phase bit line of the differential amplifier upon reading accessing to the static RAM as a dynamic output.

With the static RAM, since various processes can be performed using the dynamic output of the static RAM from the second output line, where a combination logic circuit is connected to the second output line, the combination logic circuit can operate at a high speed, and consequently, the throughput of a circuit block which includes the static RAM can be very much improved. Further, the static RAM is advantageous also in that, since the two different kinds of output lines are provided, the load such as the number of gates and/or the capacity of wiring lines connected to each of the output lines can be reduced.

According to another aspect of the present invention, there is provided a processing apparatus, comprising a static RAM constructed using a dynamic circuit for pre-charging and discharging a bit line and including a RAM cell for storing data, a differential amplifier for amplifying a signal read out from the RAM cell, a level keeping circuit for keeping a level of a signal outputted from the differential amplifier, a first output line for outputting an output signal of a kept level from the level keeping circuit upon reading accessing to the static RAM as a static output, and a second output line for outputting a state of at least one of a positive phase bit line and an inverted phase bit line of the differential amplifier upon reading accessing to the static RAM as a dynamic output, and a parity check circuit connected to the second output line of the static RAM for checking parity of data of a dynamic output outputted from the second line of the static RAM.

With the processing apparatus, parity check processing by the parity check circuit can be performed earlier than the timing at which a static output is outputted from the first output line of the static RAM. Consequently, the parity check circuit can operate at a high speed, and the throughput of a circuit block which includes the static RAM and the parity check circuit can be improved very much.

According to a further aspect of the present invention, there is provided a processing apparatus, comprising a plurality of static RAMs each constructed using a dynamic circuit for pre-charging and discharging a bit line and including a RAM cell for storing data, a differential amplifier for amplifying a signal read out from the RAM cell, a level keeping circuit for keeping a level of a signal outputted from the differential amplifier, a first output line for outputting an output signal of a kept level from the level keeping circuit upon reading accessing to the static RAM as a static output, and a second output line for outputting a state of at least one of a positive phase bit line and an inverted phase bit line of the differential amplifier upon reading accessing to the static RAM as a dynamic output, and a comparison circuit connected to the second output lines of the static RAMs for comparing data of dynamic outputs outputted from the second output lines of the static RAMs with each other.

With the processing apparatus, comparison processing by the comparison circuit can be performed earlier than the timing at which a static output is outputted from the first output line of the static RAM. Consequently, the comparison circuit can operate at a high speed, and the throughput of a circuit block which includes the static RAM and the comparison circuit can be improved very much.

According to a still further aspect of the present invention, there is provided a processing apparatus, comprising a static RAM constructed using a dynamic circuit for pre-charging and discharging a bit line and including a RAM cell for storing data, a differential amplifier for amplifying a signal read out from the RAM cell, a level keeping circuit for keeping a level of a signal outputted from the differential amplifier, a first output line for outputting an output signal of a kept level from the level keeping circuit upon reading accessing to the static RAM as a static output, and a second output line for outputting a state of at least one of a positive phase bit line and an inverted phase bit line of the differential amplifier upon reading accessing to the static RAM as a dynamic output, a sequential logic circuit connected to the first output line of the static RAM, and a combination logic circuit connected to the second output line of the static RAM.

With the processing apparatus, since the sequential logic circuit and the combination logic circuit are connected to the first and second output lines of the static RAM, respectively, the combination logic circuit can operate at a high speed, and the throughput of a circuit block which includes the static RAM, the sequential logic circuit and the combination logic circuit can be improved very much. Further, the processing apparatus is advantageous also in that, since the two different kinds of output lines are provided for the static RAM, the load such as the number of gates and/or the capacity of wiring lines connected to each of the output lines can be reduced.

Further objects, features and advantages of the present invention will become apparent from the following detailed description when read in conjunction with the accompanying drawings in which like parts or elements are denoted by like reference characters.

DESCRIPTION OF THE PREFERRED EMBODIMENTS

Figure 1:
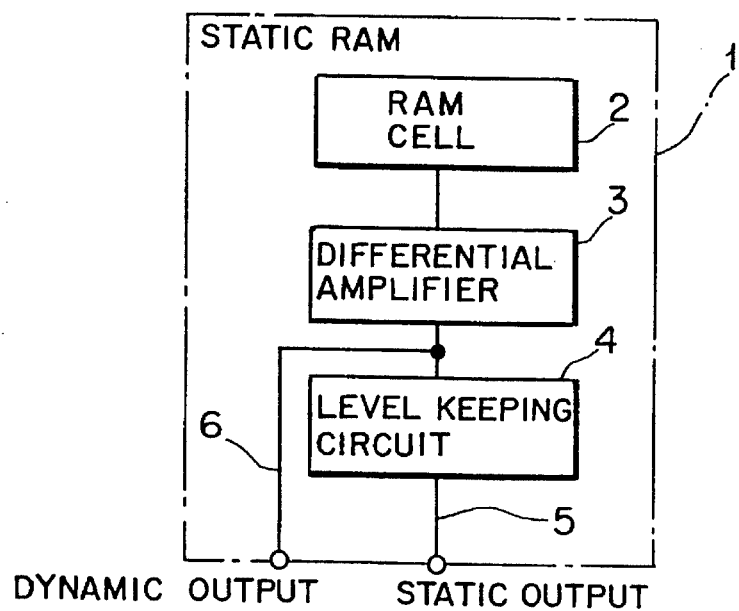
FIGS. 1 to 4 are block diagrams illustrating different aspects of the present invention.

Referring first to FIG. 1, there is shown a static RAM according to one aspect of the present invention. The static RAM is generally denoted at 1 and employs a dynamic circuit which pre-charges and discharges a bit line. The static RAM 1 includes a RAM cell 2, a differential amplifier 3 and a level keeping circuit 4.

The differential amplifier 3 amplifies a signal read out from the RAM cell 2, and the level keeping circuit 4 keeps the level of the signal amplified by the differential amplifier 3.

The static RAM 1 has a first output line 5 for outputting a signal of a kept level (output of the level keeping circuit 4) amplified by the differential amplifier 3 upon reading accessing to the static RAM 1 as a static output, and a second output line 6 for outputting a state (output of the differential amplifier 3) of at least one of a positive (non-inverted) phase bit line and an inverted phase bit line of the differential amplifier 3 upon reading accessing to the static RAM 1 as a dynamic output.

In the static RAM 1 described above with reference to FIG. 1, upon reading accessing to it, a signal from the differential amplifier 3 having a level kept by the level keeping circuit 4 is outputted as a static output from the first output line 5 while a state of at least one of the positive phase bit line and the inverted phase bit line of the differential amplifier 3 is outputted as a dynamic output from the second output line 6.

Accordingly, various processes can be performed using the dynamic output from the second output line 6 of the static RAM 1. The dynamic output is outputted at a timing earlier than the timing of the static output by an interval of time required for a signal to be outputted from the level keeping circuit 4 after it is latched by the level keeping circuit 4. Accordingly, where a combination logic circuit constructed as a dynamic circuit is connected to the second output line 6, the combination logic circuit can operate at a high speed, and consequently, the throughput of a circuit block which includes the static RAM 1 can be improved very much. Further, since the two different kinds of output lines 5 and 6 are provided, the static RAM 1 is advantageous also in that the load such as the number of gates and/or the capacity of wiring lines to be connected to each of the output lines 5 and 6 can be reduced accordingly.

Figure 2:
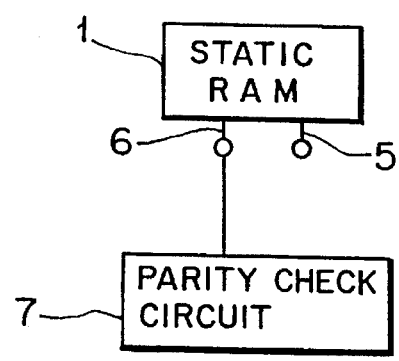

Referring now to FIG. 2, there is shown a processing apparatus according to another aspect of the present invention. The processing apparatus shown includes a static RAM 1 having a first output line 5 and a second output line 6 described above with reference to FIG. 1, and a parity check circuit 7 for checking parity of data outputted from the static RAM 1.

The parity check circuit 7 is connected to the second output line 6 of the static RAM 1 and checks parity of data using a dynamic output from the second output line 6.

In the present processing apparatus which includes the static RAM 1 described above, since a parity check is performed by the parity check circuit 7 using a dynamic output from the second output line 6 of the static RAM 1, parity check processing by the parity check circuit 7 can be performed at a timing earlier than the timing at which a static output is outputted from the first output line 5. Consequently, the parity check circuit 7 can operate at a higher speed, and the throughput of a circuit block which includes the static RAM 1 and the parity check circuit 7 can be improved very much.

Figure 3:
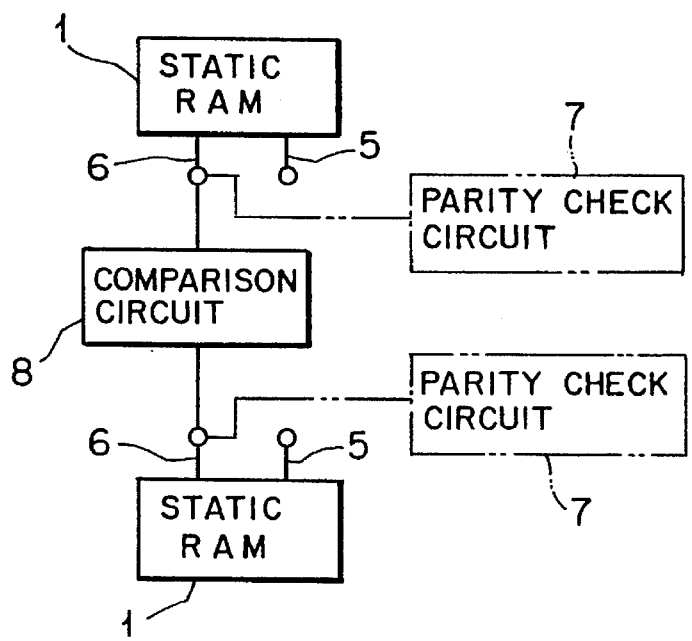

Referring now to FIG. 3, there is shown a processing apparatus according to a further aspect of the present invention. The processing apparatus shown includes at least two static RAMs 1 each having a first output line 5 and a second output line 6 described hereinabove with reference to FIG. 1, and a comparison circuit 8 for comparing data outputted from the static RAMs 1 with each other.

The comparison circuit 8 is connected to the second output lines 6 of the static RAMs 1 and compares data from the static RAMS 1 using dynamic outputs from the second output lines 6.

The processing apparatus may include, similarly as in the processing apparatus described above with reference to FIG. 2, a parity check circuit 7 provided for each of the static RAMs 1 for checking parity of data outputted from the static RAM 1. Each of the parity check circuits 7 may be connected to the second output line 6 of the corresponding static RAM 1 so that it may perform a parity check using a dynamic output from the second output line 6.

In the present processing apparatus in which the static RAM 1 is provided by a plural number, comparison of data is performed by the comparison circuit 8 using dynamic outputs from the second output lines 6 of the static RAMs 1. Consequently, comparison processing by the comparison circuit 8 can be performed at a timing earlier than the timing at which static outputs are outputted from the first output line 5. Accordingly, the comparison circuit 8 can operate at a high speed, and the throughput of a circuit block which includes the static RAM 1 and the comparison circuit 8 can be improved very much.

Where the processing apparatus includes the parity check circuits 7, similarly as in the processing apparatus shown in FIG. 2, each of the parity check circuits 7 performs a parity check using a dynamic output from the second output line 6 of the corresponding static RAM 1. Consequently, parity check processing by the parity check circuit 7 can be performed at a timing earlier than the timing at which a static output is outputted from the corresponding first output line 5. In short, where the parity check circuits 7 are connected to the second output lines 6, a parity check can be performed simultaneously with comparison processing. Also in this instance, the parity check circuits 7 can operate at a high speed, and the throughput of a circuit block which includes the static RAM 1, the parity check circuit 7 and the comparison circuit 8 can be improved very much.

Figure 4:
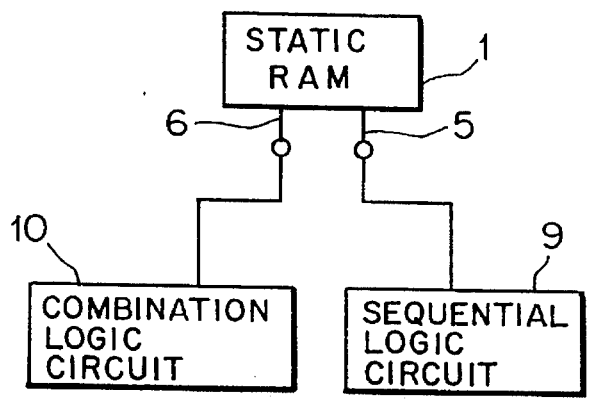

Referring now to FIG. 4, there is shown a processing apparatus according to a still further aspect of the present invention. The processing apparatus shown includes a static RAM 1 having a first output line 5 and a second output line 6 described hereinabove with reference to FIG. 1, a sequential logic circuit 9 connected to the first output line 5 of the static RAM 1, and a combination logic circuit 10 connected to the second output line 6 of the static RAM 1.

In the present processing apparatus which includes the static RAM 1, since the sequential logic circuit 9 is connected to the first output line 5 and the combination logic circuit 10 is connected to the second output line 6, the combination logic circuit 10 can operate at a high speed. Further, since the static RAM 1 has the two different kinds of output lines 5 and 6, the load such as the number of gates and/or the capacity of wiring lines to be connected to each of the output lines 5 and 6 can be reduced accordingly.

Consequently, the processing apparatus is advantageous in that the throughput of a circuit block which includes the static RAM 1, the sequential logic circuit 9 and the combination logic circuit 10 can be improved very much and also in that, since the two different kinds of output lines 5 and 6 are provided, the load to each of the output lines 5 and 6 such as the number of gates or the capacity of wiring lines can be reduced accordingly.

Figure 5:
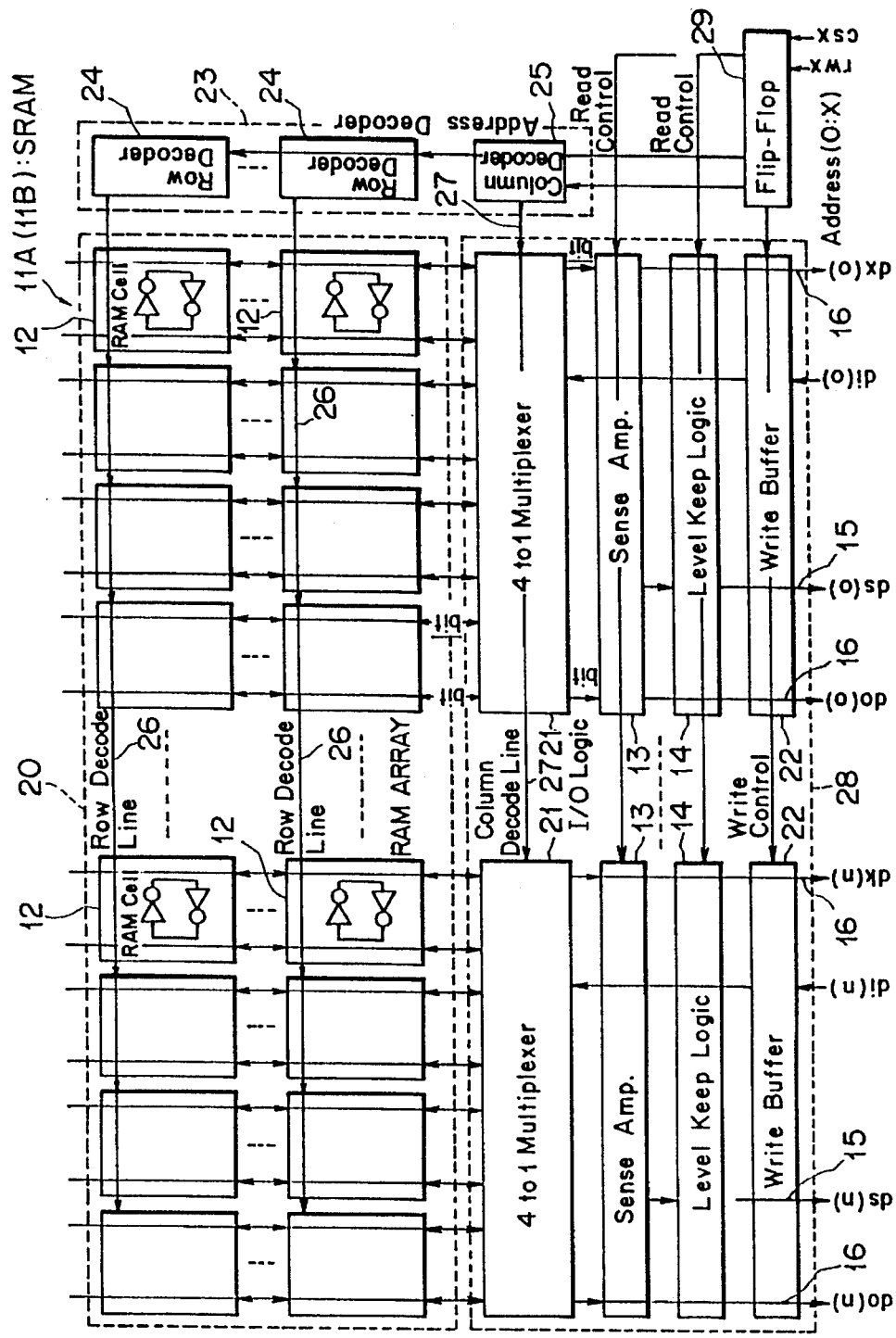
FIG. 5 is a block diagram showing a detailed construction of a static RAW to which the present invention is applied.

Referring now FIG. 5, there is shown a construction of a static RAM to which the present invention is applied. The static RAM is shown as a block including a RAM array (n bits x m entries) and logic circuits associated with inputs and outputs of the RAM array, and for convenience of description, the block may be hereinafter referred to as SRAM or RAM block.

The SRAM (RAM block) to which the present invention is applied is generally denoted at 11A (11B) and includes a dynamic circuit of the n-bit x m-entry type which pre-charges and discharges bit lines.

The SRAM 11A (11B) includes a RAM array 20 which includes n x m RAM cells 12 arranged in a grid configuration as well as an address decoder 23, an input/output circuit 28, and a flip-flop apparatus 29.

The input/output circuit 28 includes a multiplexer (4 to 1 Multiplexer) 21 for multiplexing data from the RAM cells 12 for each 4 bits, and includes, for each of the multiplexers 21, a sense amplifier (Sense Amp.; differential amplifier) 13, a level keeping circuit (Level Keep Logic) 14 and a write buffer (input flip-flop) 22.

The sense amplifier 13 amplifies a 1-bit signal column selected by the multiplexer 21 from among 4 bits read out from the corresponding RAM cells 12. The level keeping circuit 14 keeps the level of a signal amplified by the sense amplifier 13. The write buffer 22 temporarily stores write data di(0:n) to be written into the RAM cells 12 of the SRAM 11A (11B). The sense amplifier 13, the level keeping circuit 14 and the write buffer 22 are provided for each of the multiplexers 21, that is, for each four bits.

The SRAM 11A (11B) has a plurality of first output lines (Static Out) 15 and a plurality of second output lines (Dynamic Out) 16. Each of the first output lines 15 outputs a signal from a corresponding one of the sense amplifiers 13 having a level kept by a corresponding one of the level keeping circuits 14 upon reading accessing to the SRAM 11A (11B) as a static output ds(0:n). Each pair of ones of the second output lines 16 output states of a positive (non-inverted) phase bit line and an inverted phase bit line of a corresponding one of the sense amplifiers 13 upon reading accessing to the SRAM 11A (11B) as dynamic outputs do(0:n) and dx(0:n), respectively.

The address decoder 23 receives and decodes address information (Address(0:x)) from an external circuit and includes a plurality of row decoders 24 and a column decoder 25. The row decoders 24 are provided for individual rows of the RAM cells 12 and each outputs a result of decoding thereof to the RAM cells 12 of the corresponding row by way of a row decode line 26. The column decoder 25 outputs a result of decoding thereof, that is, a multiplex control signal, to the multiplexers 21 by way of a column decode line 27.

The flip-flop apparatus 29 temporarily stores address information Address(0:1) from the external circuit, a signal rwx indicative of reading/writing accessing, a chip select signal csx and other necessary signal or signals. In response to data stored in the flip-flop apparatus 29, either read control signals (Read Control) are provided to the sense amplifiers 13 and the level keeping circuits 14 or write control signals (Write Control) are provided to the write buffers 22 from the address decoder 23. Further, also a signal pcs for pre-charging or discharging a bit line is inputted to the address decoder 23.

Figure 6:
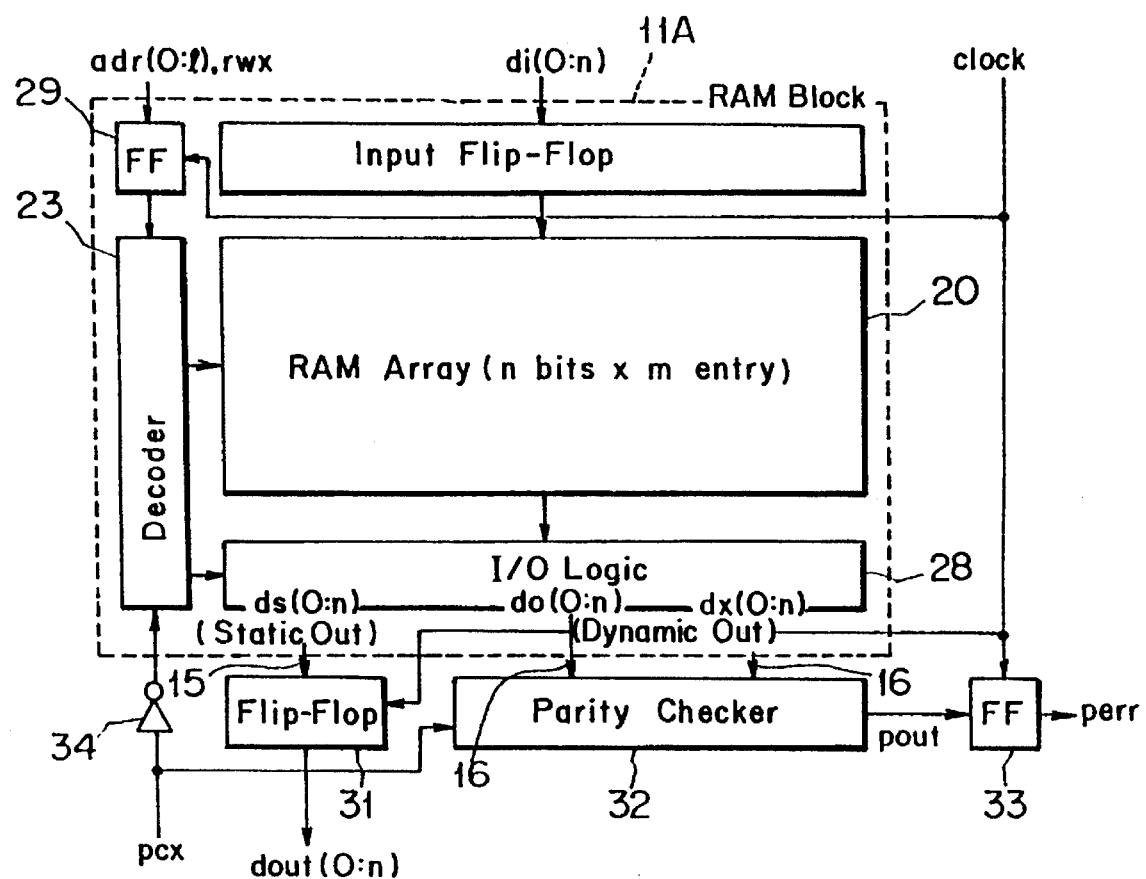
FIG. 6 is a block diagram showing a construction of a processing apparatus employing the static RAM of FIG. 5 to which the present invention is applied.

Referring now to FIG. 6, there is shown a processing apparatus employing a static RAM to which the present invention is applied.

The processing apparatus shown includes a SRAM (RAM Block) 11A constituted from a dynamic circuit as shown in FIG. 5, a flip-flop apparatus (sequential logic circuit) 31 connected to a plurality of first output lines 15 (only one is shown in FIG. 6) of the SRAM 11A for outputting data, and a parity check circuit (Parity Checker; combination logic circuit) 32 connected to a plurality of pairs of second output lines 16 (only one pair is shown in FIG. 6) of the SRAM 11A for checking parity of data outputted from the SRAM 11A.

In particular, since any of dynamic outputs do and dx of the SRAM 11A cannot be used with the flip-flop apparatus 31 which is a sequential logic circuit which operates in synchronism with a clock signal, a static output ds from the first output lines 15 is inputted to the flip-flop apparatus 31. In contrast, since the parity check circuit 32 is constructed as a dynamic circuit and consequently the dynamic outputs do and dx can be used with the parity check circuit 32 which is a combination logic circuit, the dynamic outputs do and dx from the second output lines 16 are inputted to the parity check circuit 32.

The flip-flop apparatus 31 fetches and temporarily stores data ds(0:n) outputted from the first output lines 15 of the SRAM 11A in response to a rising edge of the clock signal, and outputs the data ds(0:n) as output data dout(0:n).

A flip-flop (FF) 33 is connected to the parity check circuit 32. The flip-flop 33 fetches and temporarily stores a result pout of a parity check of the parity check circuit 32 in response to a rising edge of the clock signal, and outputs the parity check result pout as a parity error signal perr (a signal which rises when a parity error occurs).

An inverter 34 inverts an active-low pre-charge signal (pre-charge clock) pcx (refer to, for example, FIG. 6) for pre-charging the bit lines of the SRAM 11A and inputs the inverted pre-charge signal to the SRAM 11A. It is to be noted that, since the pre-charge signal pcx is applied to the parity check circuit 32 without being inverted, when the SRAM 11A is within a pre-charge period (Pre-Charge Cycle), the parity check circuit 32 is within a discharging period, and when the SRAM 11A is within a discharging period, the parity check circuit 32 is within a pre-charge period as seen from FIG. 8.

In the present processing apparatus, the parity check circuit 32 is constructed such that a plurality of odd parity checkers (or even parity checkers) having inputs of a four bit construction are combined so that a parity check of n bits can be performed. The parity check circuit 32 is constructed as a so-called domino circuit wherein, once the state of a pre-charge line changes to a low state, this state propagates between logic gates so that the output state changes to a high state and then the output does not exhibit a change till a next pre-charge cycle even if the input changes.

Figure 7:
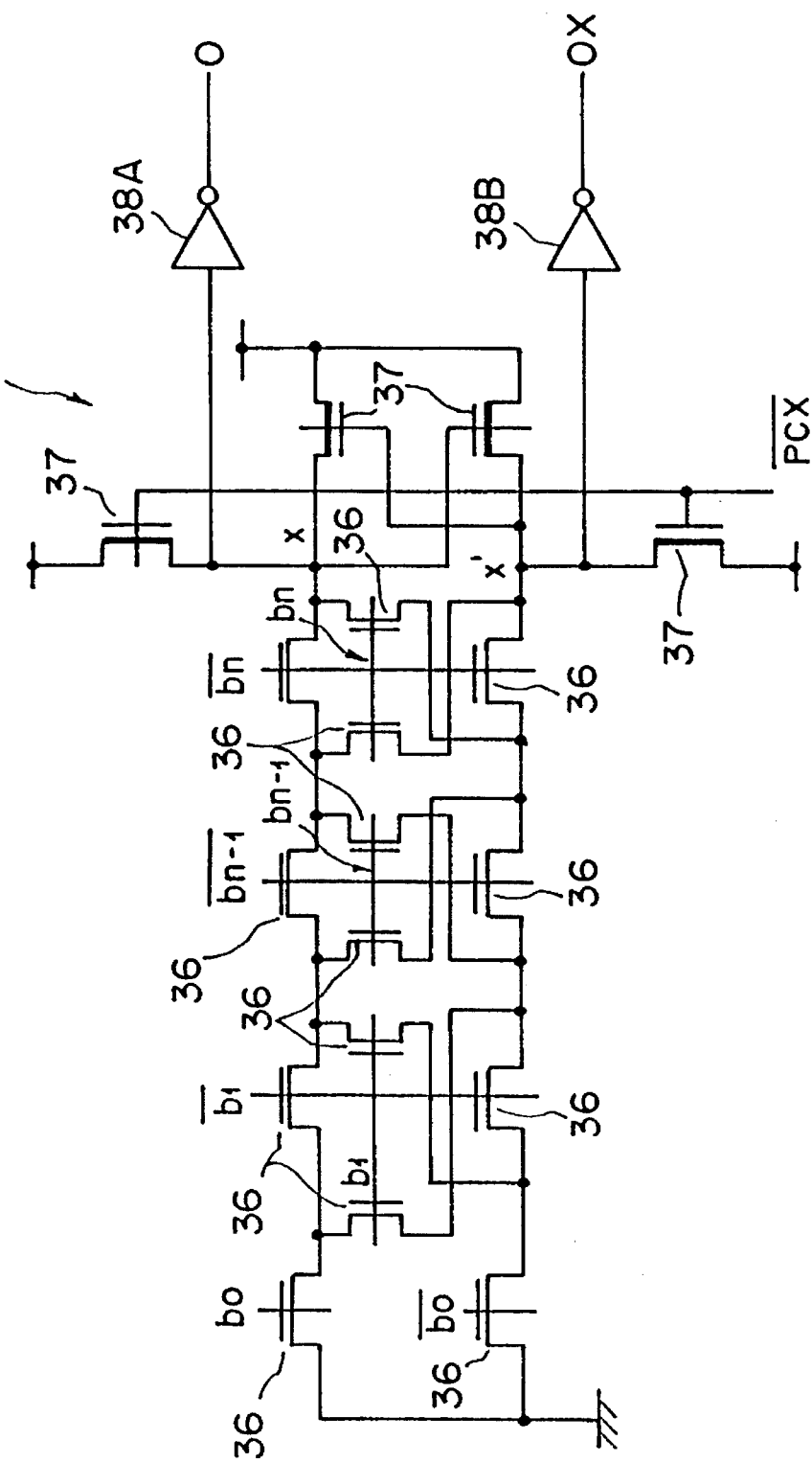
FIG. 7 is a circuit diagram showing a detailed construction of a parity check circuit of the processing apparatus shown in FIG. 6.

A more detailed construction of the parity check circuit 32 is shown in FIG. 7. Referring to FIG. 7, the parity check circuit 32 shown includes a plurality of n-channel MOS transistors 36, two pairs of p-channel MOS transistors 37, and a pair of inverters 38A and 38B which output outputs o and ox representative of a result of a parity check by the parity check circuit 32.

The parity check circuit 32 shown in FIG. 7 checks parity of a train of bits b0, b1, . . . , bn when the bit train is inputted thereto. The parity check circuit 32 requires also that inverted signals of the individual bits b0, b1, . . . , bn be inputted thereto, and in the processing apparatus shown in FIG. 6, the dynamic outputs do (positive phase) and dx (inverted phase) from the SRAM 11A are used as inputs to the parity check circuit 32. If the inverted signal of the pre-charge clock signal pcx becomes active, then pre-charge lines x and x' of the parity check circuit 32 are charged to a high level state.

If the state of any one of the bit inputs changes to a low state even once within a discharging period of the parity check circuit 32, then the output o of the inverter 38A is settled to the high state, and thereafter, even if the input changes, the output does not exhibit a variation till a next pre-charge period. On the contrary, if the state of none of the bit inputs changes to a low state, since the charge of the pre-charge line x is not discharged, the output o of the inverter 38A remains in the low state. However, since the pre-charge line x' discharges and changes to a low state, the output of the inverter 38B is settled to the high state, thereby exhibiting an odd parity error (or an even parity OK).

Subsequently, operation of the processing apparatus having the construction described above upon reading accessing will be described with reference to a time chart shown in FIG. 8.

Figure 13:
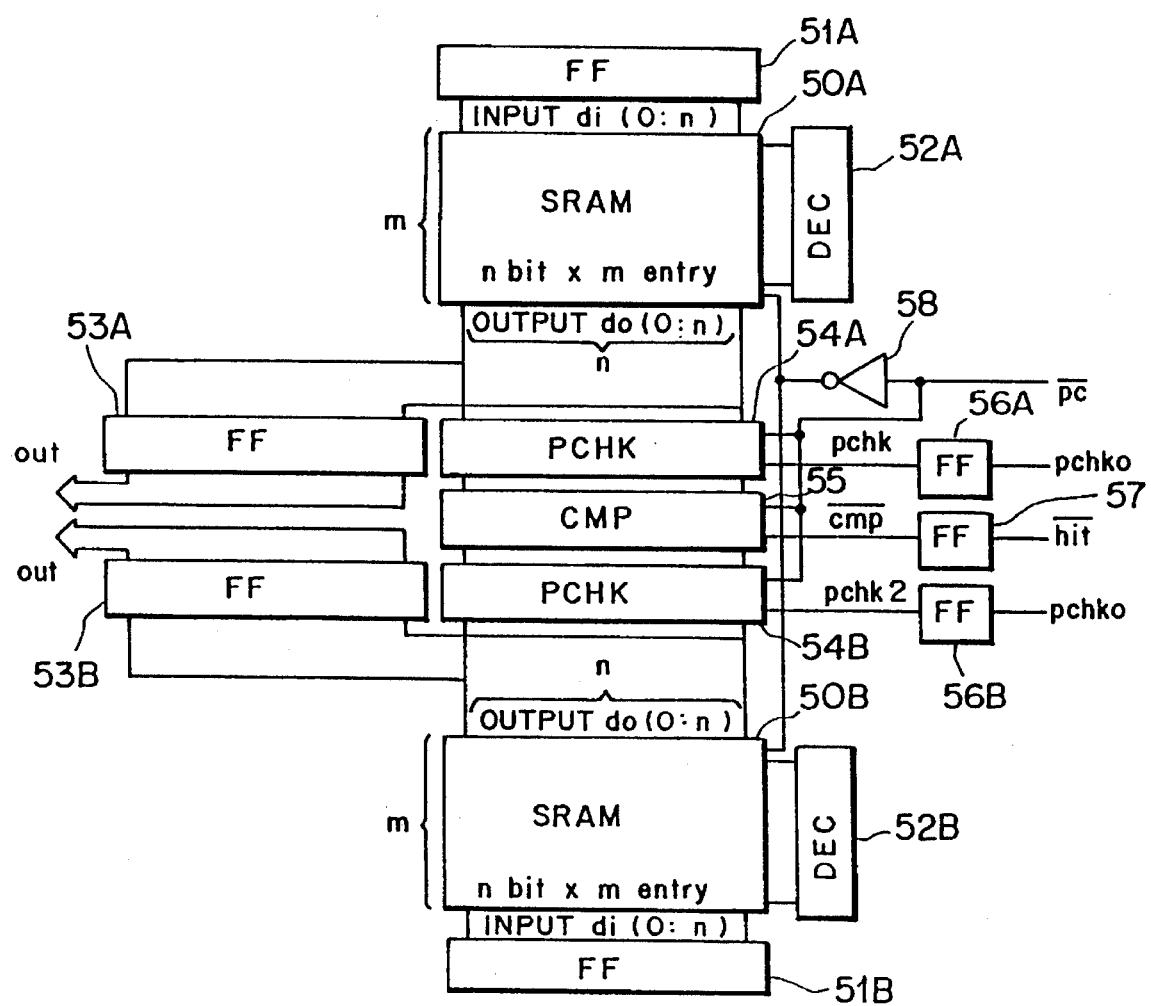
FIG. 13 is a block diagram showing an ordinary processing apparatus which employs a static RAM.
Figure 14:
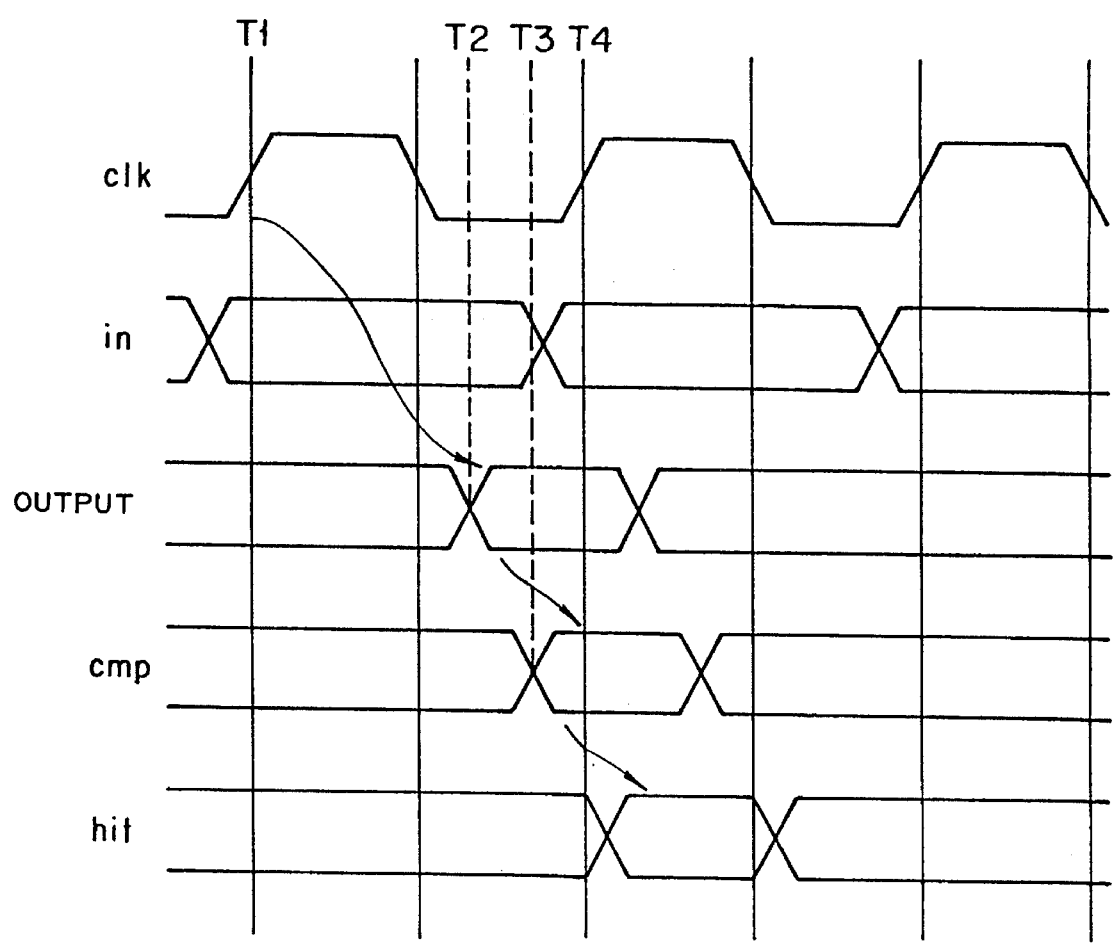
FIG. 14 is a timing diagram chart illustrating operation of the processing apparatus shown in FIG. 13.

In a conventional SRAM (refer to the SRAM 50A or 50B shown in FIG. 13), only the first output lines (lines which output a static output ds of a kept level) shown in FIG. 6 are provided. As can apparently be seen from the static output ds illustrated in FIG. 8, the limitation to the propagation delay of a combination logic circuit/sequence logic circuit connected to the first output lines 15 becomes severe as the clock cycle becomes short.

In contrast, the SRAM 11A in the present processing apparatus includes, in addition to the first output lines 15 for the static output ds, the second output lines 16 for outputting the dynamic outputs do (positive phase) and dx (inverted phase) of a sense amplifier 13. Upon reading accessing, the dynamic outputs do and dx are inputted from the second output lines 16 to the parity check circuit 32 as a combination logic circuit constituted from a domino circuit or the like. Consequently, a parity check is performed by the parity check circuit 32 using the dynamic outputs do and dx.

Figure 8:
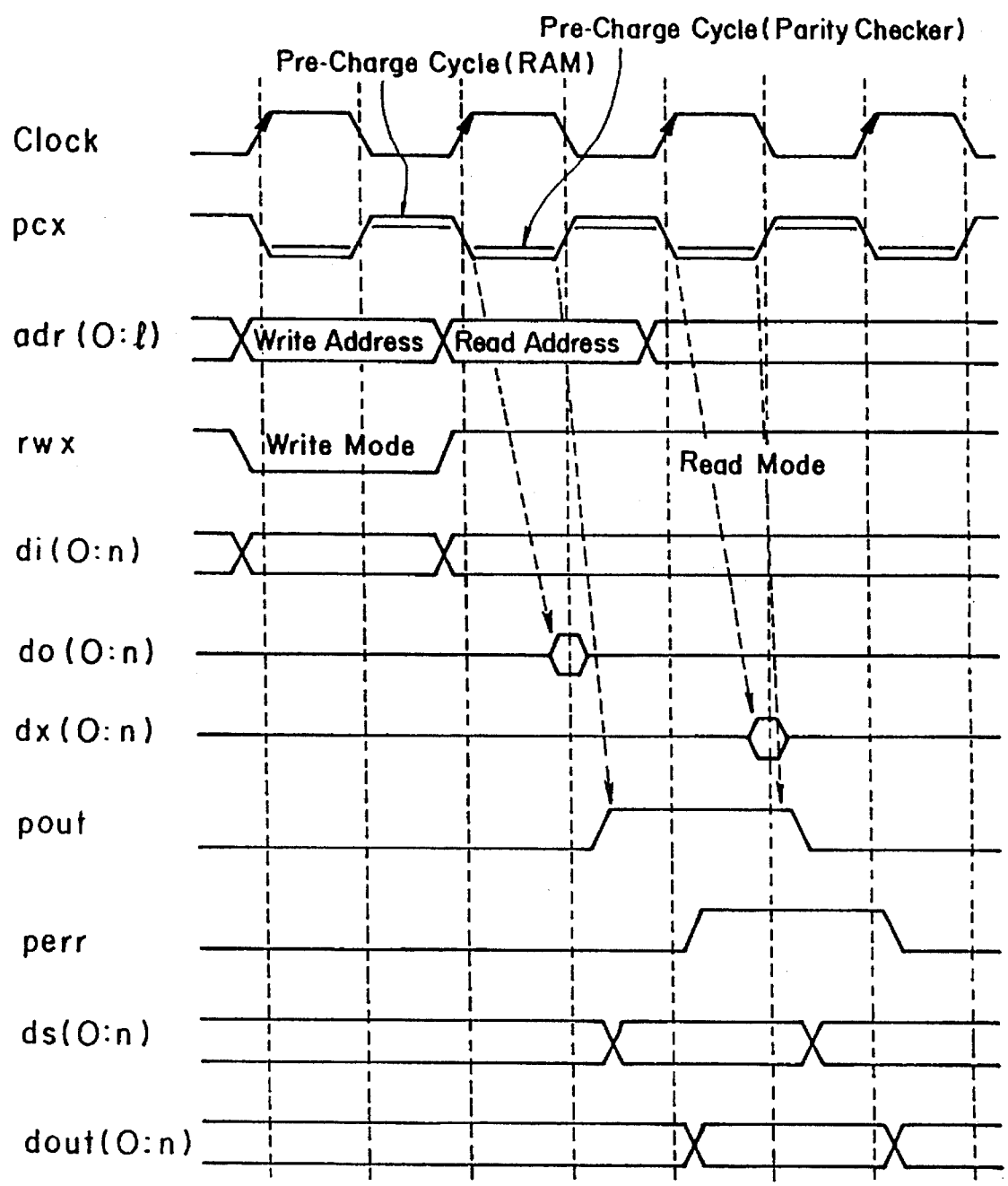
FIG. 8 is a timing diagram illustrating operation of the processing apparatus shown in FIG. 6.

Further, as seen from FIG. 8, while a discharging cycle of the SRAM 11A (period within which the SRAM 11A operates) has the same phase as the clock signal, the dynamic outputs do and dx of the SRAM 11A are outputted in the latter half of the clock cycle due to a delay of the internal circuit. Therefore, the parity check circuit 32 which receives and operates in response to the dynamic outputs do and dx of the SRAM 11A must have a discharging period in the latter half of the clock cycle. Accordingly, the pre-charge period of the parity check circuit 32 has an opposite phase (in a condition wherein it is displaced by one half period of the clock signal) to the pre-charge period of the SRAM 11A. Consequently, when the SRAM 11A is in a discharging period, the parity check circuit 32 is in a pre-charge period.

Since the dynamic outputs do and dx are outputted earlier than the static output ds outputted from the first output lines 15 by a time equal to the time required for a signal to be outputted from a level keeping circuit 14 after the signal is latched by the level keeping circuit 14, also the parity check result pout from the parity check circuit 32 is obtained earlier and stored into the flip-flop 33.

Then, in a cycle next to the cycle in which the SRAM 11A is accessed for reading, the data dour is outputted from the flip-flop apparatus 31, and simultaneously, a parity error signal perr can be outputted from the flip-flop 33. It is to be noted that a condition wherein a parity error occurs (the signals pout and perr rise) in the reading accessing is illustrated in FIG. 8.

In this manner, with the processing apparatus described above with reference to FIGS. 6 to 8, since the parity check circuit 32 which is a combination logic circuit other than the flip-flop apparatus 31, which is a sequential logic circuit into which a value is fetched in synchronism with a clock signal, or the like is constituted from a dynamic circuit and the dynamic outputs do and dx of the SRAM 11A are used as input data to the parity check circuit 32, the parity check circuit 32 can operate at a higher speed than any ordinary combination logic circuit which is constituted from static gates. Consequently, the throughput of a circuit block which includes the SRAM 11A and the parity check circuit 32 can be improved very much. The processing apparatus is further advantageous in that, since the two different kinds of output lines 15 and 16 are provided, the load such as the number of gates or the capacity of wiring lines to each of the output lines 15 and 16 can be reduced accordingly.

Figure 9:
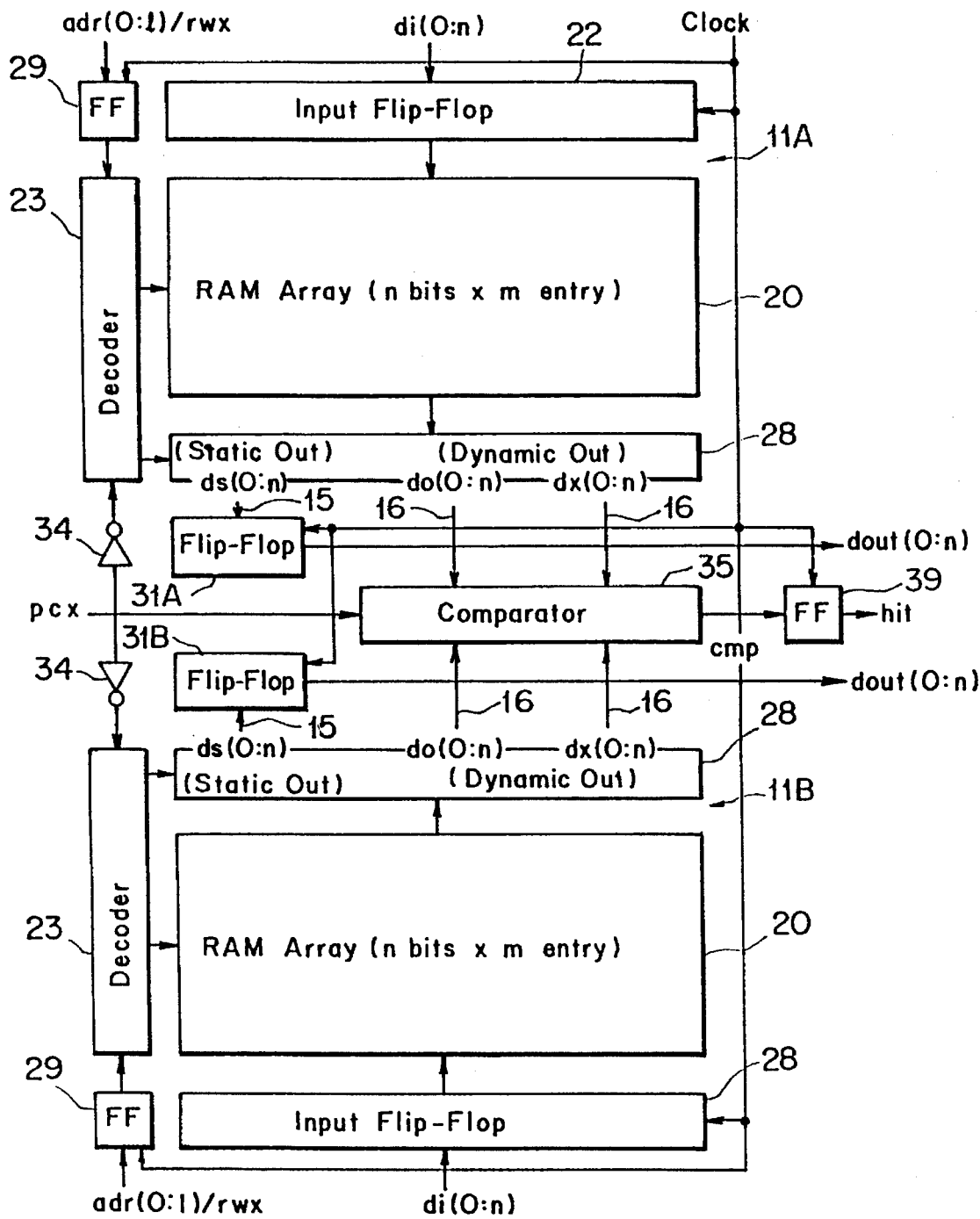
FIG. 9 is a block diagram showing a construction of another processing apparatus including the static RAW of FIG. 5 to which the present invention is applied.

Referring now to FIG. 9, there is shown a construction of another processing apparatus employing a static RAM to which the present invention is applied.

The present processing apparatus includes a pair of SRAMs 11A and 11B each constituted from a dynamic circuit shown in FIG. 5, a pair of flip-flop apparatus (sequential logic circuits) 31A and 31B connected to first output lines 15 (only one is shown for each of the SRAMS 11A and 11B) of the SRAMs 11A and 11B, respectively, for temporarily storing data to be outputted, and a comparison circuit (comparator; combination logic circuit) 35 connected to pairs of second output lines 16 (only one pair is shown for each of the SRAMs 11A and 11B) of the SRAMs 11A and 11B for comparing data outputted from the SRAMs 11A and 11B with each other.

In particular, similarly as in the first processing apparatus described above, since dynamic outputs do and dx of the SRAMs 11A and 11B cannot be used with the flip-flop apparatus 31A and 31B which are sequential logic circuits which operate in synchronism with a clock signal, static outputs ds from the first output lines 15 of the SRAMs 11A and 11B are inputted to the flip-flop apparatus 31A and 31B, respectively. Meanwhile, since the comparison circuit 35 is constructed as a dynamic circuit and consequently the dynamic outputs do and dx can be used with the comparison circuit 35 which is a combination logic circuit, the dynamic outputs do and dx from the second output lines 16 are inputted to the comparison circuit 35.

Here, the flip-flop apparatus 31A and 31B fetch and temporarily store data ds(0:n) outputted from the first output lines 15 of the SRAMs 11A and 11B, respectively, in response to a rising edge of the clock signal, and output the stored data ds(0:n) as output data dout(0:n).

Meanwhile, a flip-flop (FF) 39 is connected to the comparison circuit 35. The flip-flop 39 fetches and temporarily stores a result cmp of comparison of the comparison circuit 35 in response to a rising edge of the clock signal, and outputs the comparison result cmp as a hit signal (a signal which rises when the compared data coincide with each other).

It is to be noted that, also in the present processing apparatus, since a pre-charge signal pcx is applied to the comparison circuit 35 without being inverted, a pre-charge period (Pre-Charge Cycle) of the SRAMs 11A and 11B corresponds to a discharging period of the comparison circuit 35, and a discharging period of the SRAMs 11A and 11B corresponds to a pre-charge period of the comparison circuit 35.

Also the comparison circuit 35 in the present processing apparatus is constituted from a domino circuit as described hereinabove. Where a domino circuit is employed in this manner, since the circuit construction is required, different from an ordinary circuit which employs static gates, only to determine whether or not charge of a pre-charge line should be discharged as described hereinabove, the comparison circuit 35 operates at a higher speed than the ordinary circuit which employs static gates. Besides, since the comparison circuit 35 is a domino circuit, the dynamic outputs do and dx of the SRAMs 11A and 11B having the construction shown in FIG. 5 can be used with the comparison circuit 35. It is to be noted that, since an ordinary combination logic circuit constituted from static gates exhibits a variation in output thereof in response to an input thereto, a dynamic output whose value is reset within a pre-charge period in this manner cannot be used as an input to the combination logic circuit.

The processing apparatus constructed in such a manner as shown in FIG. 9 is used, for example, to check a tag of a cache memory (not shown) of the direct mapping type, that is, to determine whether or not data of a requested address is stored in the cache memory (hit/miss). For example, the SRAM 11A is used as a tag (Tag) storage section for storing tag information of the cache memory (part of address information of data stored in the cache memory) while the SRAM 11B is used as a physical address storage section of an address translation buffer (TLB: Translation Look-aside Buffer) for storing a requested physical address.

When address information is read out from the SRAMs 11A and 11B upon reading accessing, the address information from the SRAM 11A and the address information from the SRAM 11B are compared with each other by the comparison circuit 35, and when they coincide with each other, the comparison circuit 35 determines this as a cache hit and outputs a hit signal so that reading accessing to the cache memory is performed in accordance with the address information from the SRAM 11A or 11B stored in the flip-flop apparatus 31A and 31B. Naturally, a logical address and a physical address are stored in one-to-one corresponding pair in the address translation buffer, and if the logical address does not coincide with the requested address, an original cash hit is not reached. However, since this function has no relation to the subject matter of the present invention, description thereof is omitted herein.

Subsequently, operation of the second processing apparatus described above upon reading accessing will be described with reference to a time chart of FIG. 10.

The comparison circuit 35 receives and operates in response to the dynamic outputs do and dx from the two SRAMs 11A and 11B.

Figure 10:
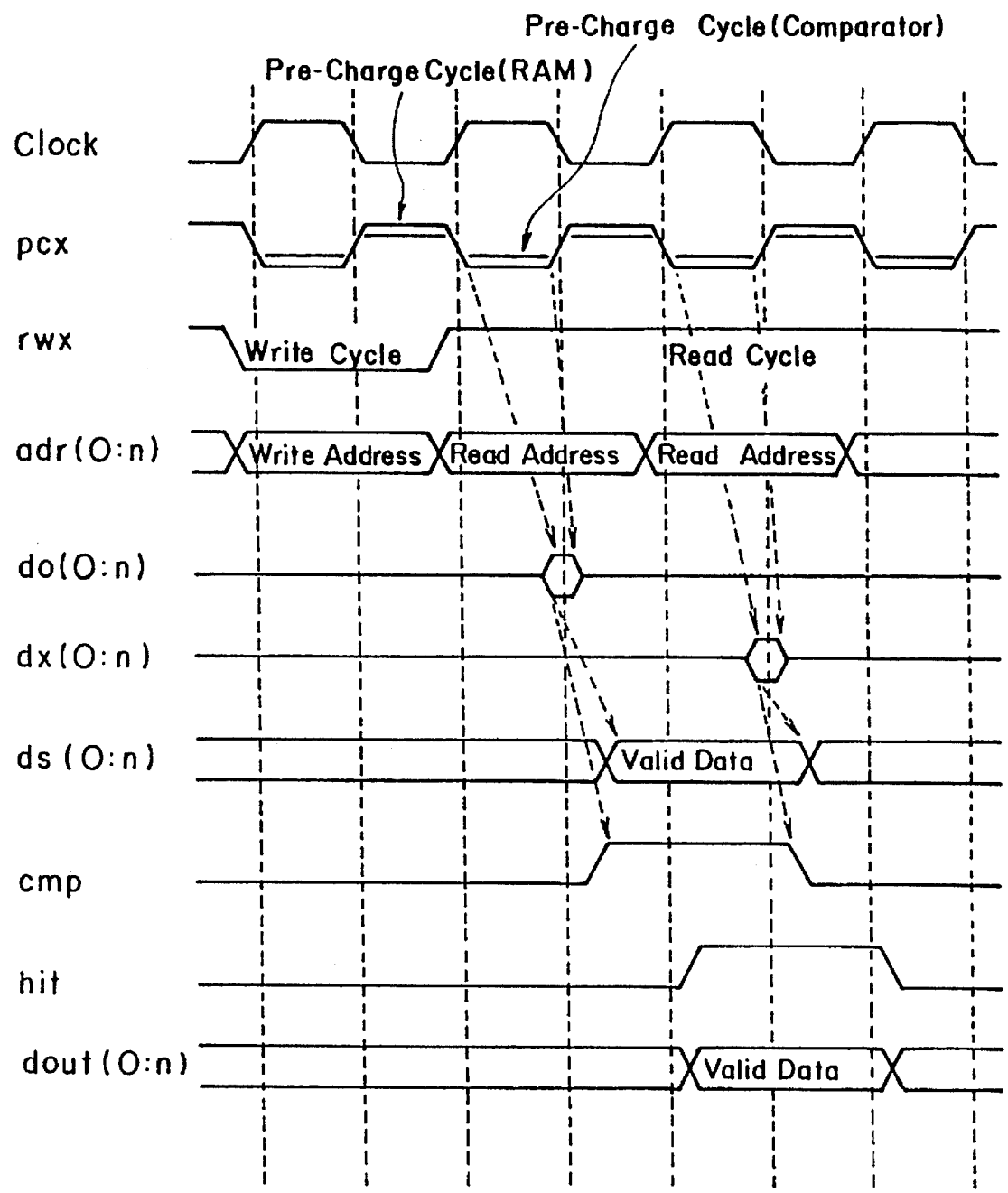
FIG. 10 is a timing diagram illustrating operation of the processing apparatus shown in FIG. 9.

As shown in FIG. 10, also in the second processing apparatus, similarly as in the first processing apparatus described above, a discharging cycle of the SRAMs 11A and 11B has the same phase as that of the clock signal. However, since the dynamic outputs do and dx of the SRAMs 11A and 11B are outputted in the latter half of a clock cycle due to a delay of the internal circuits, the comparison circuit 35 which receives and operates in response to the dynamic outputs do and dx of the SRAMs 11A and 11B must have a discharging period in the latter half of the clock cycle. Consequently, a pre-charge period of the comparison circuit 35 has an opposite phase to that of a pre-charge period of the SRAMs 11A and 11B such that, when the SRAMs 11A and 11B is within a discharge period, the comparison circuit 35 is within a pre-charge period.

Further, since the dynamic outputs do and dx are outputted earlier than static output ds outputted from the first output lines 15 by a time equal to the time required for a signal to be outputted from a level keeping circuit 14 after the signal is latched by the level keeping circuit 14, also a comparison result cmp by the comparison circuit 35 is obtained earlier and stored into the flip-flop 39.

Then, in a next cycle to the clock cycle in which the present reading accessing occurs, the data dour are outputted from the flip-flop apparatus 31A and 31B, and simultaneously, a hit signal can be outputted from the flip-flop 39. It is to be noted that, in FIG. 10, a condition wherein data from the flip-flop apparatus 31A and 31B coincide with each other (a condition wherein a hit signal rises) is illustrated.

In this manner, with the second processing apparatus described above, since the comparison circuit 35 which is a combination logic circuit other than the flip-flop apparatus 31A and 31B, which are sequential logic circuits wherein a value is fetched in synchronism with a clock signal, or the like is constituted from a dynamic circuit and the dynamic outputs do and dx of the SRAMs 11A and 11B are used as input data to the comparison circuit 35, the comparison circuit 35 can operate at a higher speed than an ordinary combination logic circuit constituted from static gates. Consequently, the throughput of a circuit block which includes the SRAMs 11A and 11B and the comparison circuit 35 can be improved very much. Further, since the two different kinds of output lines 15 and 16 are provided similarly as in the first processing apparatus, the second processing apparatus is advantageous also in that the load such as the number of gates or the capacity of wiring lines to each of the output lines 15 and 16 can be reduced accordingly.

It is to be noted that, while the second processing apparatus described above includes the two SRAMs 11A and 11B and is used with a cache memory of the direct mapping type, the present invention can be similarly applied to any other processing apparatus which includes three or more SRAMs. For example, a circuit which employs a cache memory of the set associative mapping type includes at least three SRAMs which are used as a tag storage section and/or a translation look-aside buffer, and determination of a cache hit must be performed based on comparisons of output values between the plurality of SRAMs. The present invention can be applied very effectively to circuits of the type just mentioned.

Figure 11:
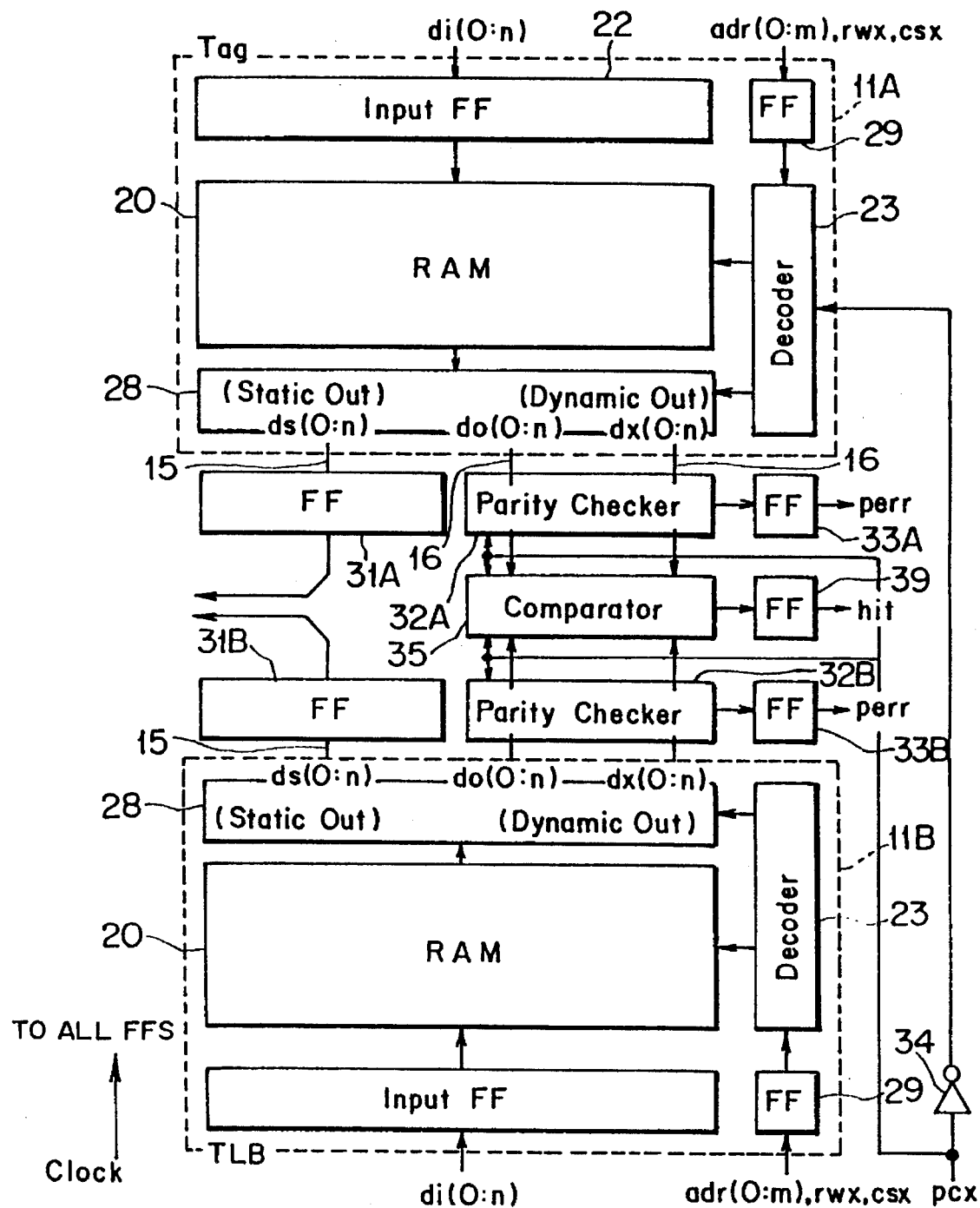
FIG. 11 is a block diagram showing a construction of a further processing apparatus including the static RAM of FIG. 5 to which the present invention is applied.

Referring now to FIG. 11, there is shown a construction of a further processing apparatus employing a static RAM to which the present invention is applied.

The processing apparatus shown has a construction which includes the first processing apparatus and the second processing apparatus described above in combination. In particular, the present processing apparatus includes a pair of SRAMs 11A and 11B each constituted from a dynamic circuit as shown in FIG. 5, a pair of flip-flop apparatus (FF) 31A and 31B connected to first output lines 15 (only one is shown for each of the SRAMs 11A and 11B) of the SRAMs 11A and 11B for temporarily storing data to be outputted, a pair of parity check circuits (Parity Checker) 32A and 32B connected to pairs of second output lines 16 (only one pair is shown for each of the SRAMs 11A and 11B) of the SRAMs 11A and 11B for checking parity of data outputted from the SRAMs 11A and 11B, and a comparison circuit (Comparator) 35 for comparing data outputted from the SRAMs 11A and 11B with each other.

The parity check circuits 32A and 32B connected to the second output lines 16 and the comparison circuit 35 are each constituted from a domino circuit similarly as in the first and second processing apparatus described hereinabove so that dynamic outputs do and dx of the SRAMs 11A and 11B can be used as inputs to the comparison circuit 35.

Also the present processing apparatus is used, similarly to the second processing apparatus, for example, to check a tag of a cache memory (not shown) of the direct mapping type, that is, to determine whether or not data of a requested address is stored in the cache memory (hit/miss), and the SRAM 11A is used as a tag storage section (Tag) while the SRAM 11B is used as a physical address storage section of a translation look-aside buffer.

When address information is read out from the SRAMs 11A and 11B upon reading accessing, a parity check of data from the SRAMs 11A and 11B is performed by the parity check circuits 32A and 32B, and the address information from the SRAM 11A is compared with the address information from the SRAM 11B by the comparison circuit 35. When the result of the comparison is coincidence, the comparison circuit 35 determines this as a cache hit and outputs a hit signal so that reading accessing to the cache memory is performed in accordance with the address information from the SRAM 11A or 11B stored in the flip-flop apparatus 31A and 31B.

A pair of flip-flops (FF) 33A and 33B are connected to the parity check circuits 32A and 32B, respectively. The flip-flops 33A and 33B fetch and temporarily store results pout of parity checks of the parity check circuits 32A and 32B, respectively, in response to a rising edge of the clock signal, and outputs the parity check results pout as parity error signals perr (signals which rise when a parity error occurs).

Subsequently, operation of the third processing apparatus having the constriction described above upon reading processing will be described with reference to a time chart shown in FIG. 12. It is to be noted that the SRAMs 11A and 11B of the present processing apparatus operate when the processing apparatus is selected by an active-low chip select signal csx.

As seen from FIG. 12, also in the present processing apparatus, similarly as in the operation of the first and second processing apparatus described hereinabove with reference to FIGS. 8 and 10, a pre-charge period of the parity check circuits 32A and 32B and the comparison circuit 35 has an opposite phase to that in a pre-charge period of the SRAMs 11A and 11B such that, when the SRAMs 11A and 11B are within a discharging period, the parity check circuits 32A and 32B and the comparison circuit 35 are within a pre-charge period.

Figure 12:
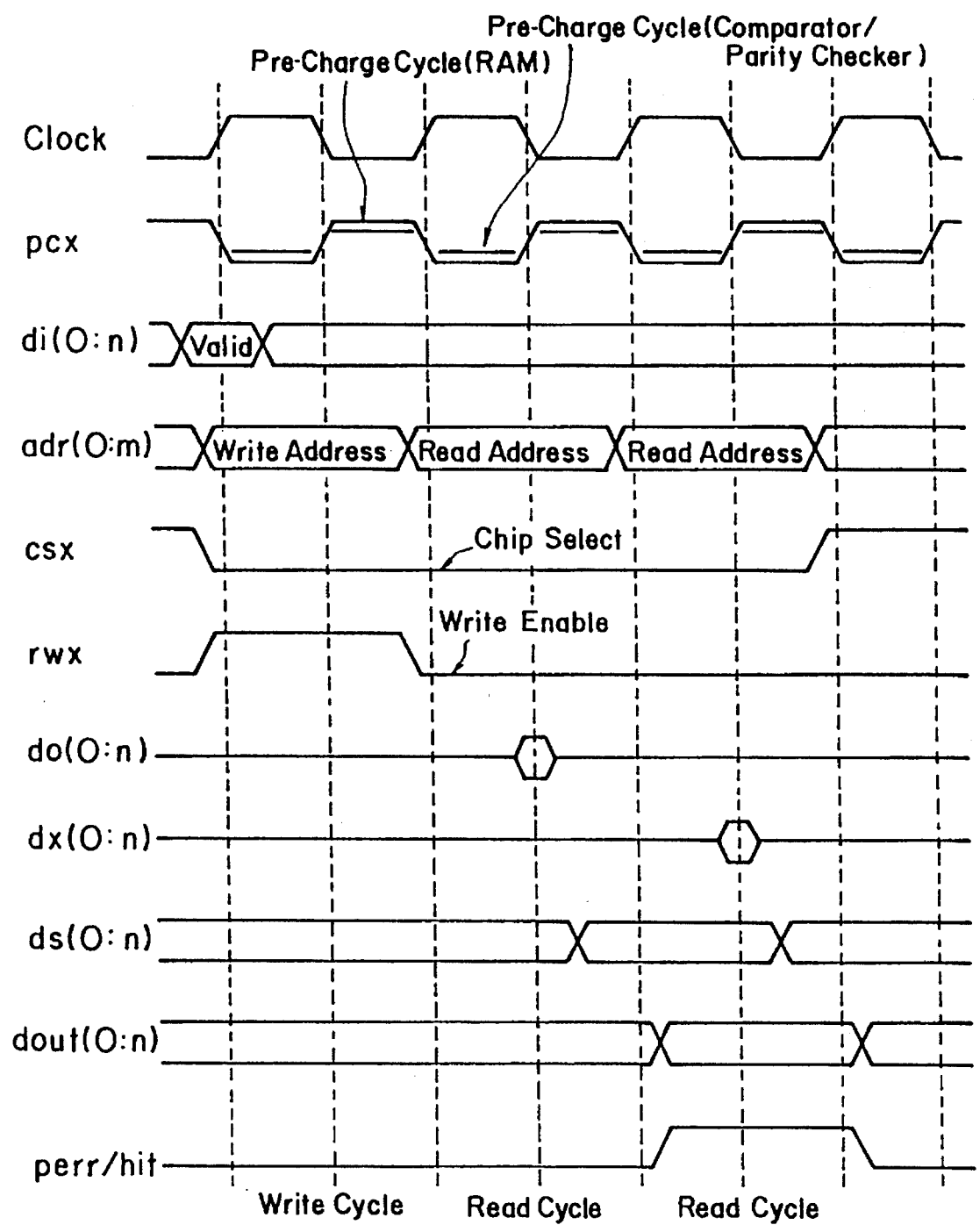
FIG. 12 is a timing diagram illustrating operation of the processing apparatus shown in FIG. 11.

Further, since the dynamic outputs do and dx are outputted earlier than the static output ds outputted from the first output lines 15 by a time equal to the time required for a signal to be outputted from a level keeping circuit 14 after the signal is latched by the level keeping circuit 14 as seen from FIG. 12, also the parity check results pout by the parity check circuits 32A and 32B and the comparison result cmp by the comparison circuit 35 are obtained earlier and stored into the flip-flops 33A, 33B and 39, respectively.

Then, in a cycle next to the clock cycle in which the present reading accessing occurs, the data dout are outputted from the flip-flop apparatus 31A and 31B, and simultaneously, parity error signals and a hit signal can be outputted from the flip-flops 33A, 33B and 39, respectively.

In this manner, with the third processing apparatus described above, similarly with the first and second processing apparatus described hereinabove, any sequential logic circuit which operates in response to an edge trigger (a rising edge of a clock signal) such as the flip-flop apparatus 31A or 31B the flip-flop 33A, 33B or 39 is connected to the first output lines 15 while any combination logic circuit such as the parity check circuit 32A or 32B or the comparison circuit 35 is constructed as a domino circuit and connected to the second output lines 16 so that they can operate suitably.

Consequently, the parity check circuits 32A and 32B and the comparison circuit 35 can operate at a higher speed than any ordinary combination logic circuit constituted from static gates, and the throughput of a circuit block which includes the SRAMs 11A and 11B, the parity check circuits 32A and 32B and the comparison circuit 35 can be improved very much. The present processing apparatus is advantageous also in that, similarly as in the first processing apparatus, since the two different kinds of output lines 15 and 16 are provided, the load such as the number of gates or the capacity of wiring lines connected to each of the output lines 15 and 16 can be reduced accordingly.

It is to be noted that, while the third processing apparatus described above includes the two SRAMs 11A and 11B, the present invention can be applied to any other processing apparatus which includes three or more SRAMs similarly to the second processing apparatus.

Further, while each of the SRAMs 11A and 11B in the first to third processing apparatus described above outputs both of a positive (non-inverted) phase output and an inverted phase output as dynamic outputs thereof, only one of them may otherwise be outputted, and also in this instance, similar advantages to those of the processing apparatus described above can be achieved.

The present invention is not limited to the specifically described embodiment, and variations and modifications may be made without departing from the scope of the present invention.

What is claimed is:

1. A static RAM constructed using a dynamic circuit for pre-charging and discharging a bit line, comprising:

a RAM cell for storing data;

a differential amplifier for amplifying a signal read out from said RAM cell;

a level keeping circuit for keeping a level of a signal outputted from said differential amplifier;

a first output line for outputting an output signal of a kept level from said level keeping circuit upon reading accessing to said static RAM as a static output; and a second output line for outputting a state of at least one of a positive phase bit line and an inverted phase bit line of said differential amplifier upon reading accessing to said static RAM as a dynamic output.

2. A processing apparatus, comprising:

a static RAM constructed using a dynamic circuit for pre-charging and discharging a bit line and including a RAM cell for storing data, a differential amplifier for amplifying a signal read out from said RAM cell, a level keeping circuit for keeping a level of a signal outputted from said differential amplifier, a first output line for outputting an output signal of a kept level from said level keeping circuit upon reading accessing to said static RAM as a static output, and a second output line for outputting a state of at least one of a positive phase bit line and an inverted phase bit line of said differential amplifier upon reading accessing to said static RAM as a dynamic output; and a parity check circuit connected to said second output line of said static RAM for checking parity of data of a dynamic output outputted from said second line of said static RAM.

3. A processing apparatus, comprising:

a plurality of static RAMs each constructed using a dynamic circuit for pre-charging and discharging a bit line and including a RAM cell for storing data, a differential amplifier for amplifying a signal read out from said RAM cell, a level keeping circuit for keeping a level of a signal outputted from said differential amplifier, a first output line for outputting an output signal of a kept level from said level keeping circuit upon reading accessing to said static RAM as a static output, and a second output line for outputting a state of at least one of a positive phase bit line and an inverted phase bit line of said differential amplifier upon reading accessing to said static RAM as a dynamic output; and a comparison circuit connected to the second output lines of said static RAMs for comparing data of dynamic outputs outputted from the second output lines of said static RAMs with each other.

4. A processing apparatus as claimed in claim 3, further comprising a parity check circuit connected to said second output line of each of said static RAMs for checking parity of data of a dynamic output outputted from said second output line.

5. A processing apparatus, comprising:

a static RAM constructed using a dynamic circuit for pre-charging and discharging a bit line and including a RAM cell for storing data, a differential amplifier for amplifying a signal read out from said RAM cell, a level keeping circuit for keeping a level of a signal outputted from said differential amplifier, a first output line for outputting an output signal of a kept level from said level keeping circuit upon reading accessing to said static RAM as a static output, and a second output line for outputting a state of at least one of a positive phase bit line and an inverted phase bit line of said differential amplifier upon reading accessing to said static RAM as a dynamic output;

a sequential logic circuit connected to said first output line of said static RAM; and a combination logic circuit connected to said second output line of said static RAM.

* * * * *